United States Patent
Adusumilli et al.

(10) Patent No.: US 9,859,219 B1
(45) Date of Patent: Jan. 2, 2018

(54) COPPER WIRING STRUCTURES WITH COPPER TITANIUM ENCAPSULATION

(71) Applicant: International Business Machines Corporation, Armonk, NY (US)

(72) Inventors: Praneet Adusumilli, Albany, NY (US); Alexander Reznicek, Troy, NY (US); Oscar van der Straten, Guilderland Center, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/414,337

(22) Filed: Jan. 24, 2017

(51) Int. Cl.
*H01L 23/52* (2006.01)
*H01L 23/532* (2006.01)
*H01L 23/528* (2006.01)
*H01L 21/768* (2006.01)
*H01L 23/31* (2006.01)

(52) U.S. Cl.
CPC .... *H01L 23/53238* (2013.01); *H01L 21/7685* (2013.01); *H01L 21/76802* (2013.01); *H01L 21/76843* (2013.01); *H01L 21/76858* (2013.01); *H01L 23/3171* (2013.01); *H01L 23/5283* (2013.01); *H01L 23/53233* (2013.01)

(58) Field of Classification Search
CPC ......... H01L 23/53238; H01L 21/76802; H01L 21/76858; H01L 23/3171; H01L 21/76843; H01L 23/5283

USPC .......................................................... 257/751
See application file for complete search history.

(56) References Cited

U.S. PATENT DOCUMENTS

| | | | |
|---|---|---|---|
| 5,310,602 A | 5/1994 | Li et al. | |
| 5,369,220 A | 11/1994 | Harada et al. | |
| 5,391,517 A * | 2/1995 | Gelatos | H01L 21/32051 257/E21.295 |
| 5,447,887 A | 9/1995 | Filipiak et al. | |
| 5,700,718 A | 12/1997 | McTeer | |
| 5,714,418 A * | 2/1998 | Bai | H01L 21/76831 257/E21.576 |
| 5,824,599 A | 10/1998 | Schacham-Diamand et al. | |
| 5,891,513 A | 4/1999 | Dubin et al. | |
| 6,159,847 A | 12/2000 | Havemann et al. | |
| 6,171,960 B1 | 1/2001 | Lee | |
| 6,259,160 B1 | 7/2001 | Lopatin et al. | |
| 6,277,985 B1 | 8/2001 | Gadwood et al. | |
| 6,342,444 B1 | 1/2002 | Higashi et al. | |
| 6,342,734 B1 | 1/2002 | Allman et al. | |
| 6,544,871 B1 | 4/2003 | Honeycutt | |
| 8,133,811 B2 * | 3/2012 | Kojima | C23C 16/0281 257/E21.16 |
| 9,685,370 B2 * | 6/2017 | Chapple-Sokol | H01L 21/76846 |
| 2014/0299988 A1 | 10/2014 | Cabral, Jr. et al. | |

* cited by examiner

*Primary Examiner* — Luan C Thai
(74) *Attorney, Agent, or Firm* — Scully, Scott, Murphy & Presser, P.C.; Daniel P. Morris, Esq.

(57) ABSTRACT

An interconnect structure including at least one copper wiring is formed embedded in an interconnect dielectric material layer. A copper titanium alloy is in direct physical contact with sidewalls, a bottommost surface and a topmost surface of the copper structure.

20 Claims, 10 Drawing Sheets

COPPER WIRING STRUCTURES WITH COPPER TITANIUM ENCAPSULATION

BACKGROUND

The present application relates to an interconnect structure and a method of forming the same. More particularly, the present application relates to copper wiring structures that are encapsulated on all surfaces (i.e., sidewalls, bottommost and topmost) by a copper titanium alloy and a method of forming such structures.

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al, based interconnects.

As the interconnect feature sizes shrink, it is necessary to scale liner thickness in order to maximize copper volume and to enable low line and via resistance. Scaling sidewall liner thickness allows reduction of line resistance, and scaling liner thickness at the via bottom allows reduction of via resistance.

For void-free Cu fill at about 20 nm critical dimensions, a liner or seed enhancement layer such as ruthenium is typically needed to avoid the formation of sidewall voids which may degrade electromigration performance. Seed layer enhancement layers have a negative impact on the line and via resistance; they displace Cu volume in lines, and add to the contact resistance in the vias.

In view of the above, there is a need for providing a single low-resistivity material which can be formed at metal/interconnect dielectric interfaces and at metal/metal interfaces that avoids the formation of seed enhancement layers and thus provides reliable interconnect structures.

SUMMARY

An interconnect structure including at least one copper wiring structure (hereinafter just "copper structure") is formed embedded in an interconnect dielectric material layer. A copper titanium alloy is in direct physical contact with sidewalls, a bottommost surface and a topmost surface of the copper structure.

In one aspect of the present application, an interconnect structure is provided. In one embodiment, the interconnect structure includes a copper structure embedded in an interconnect dielectric material layer. The copper structure has sidewalls, a bottommost surface and a topmost surface. A copper titanium alloy is in direct physical contact with the sidewalls, the bottommost surface and the topmost surface of the copper structure.

In another embodiment, the interconnect structure includes a first copper structure embedded in a first interconnect dielectric material layer. The first copper structure has sidewalls, a bottommost surface and a topmost surface. A second copper structure is located above the first copper structure and embedded in a second interconnect dielectric material layer. The second copper structure has sidewalls, a bottommost surface and a topmost surface. A copper titanium alloy is in direct physical contact with the sidewalls, the bottommost surface and the topmost surface of the first and second copper structures.

In other aspect of the present application, a method of forming an interconnect structure is provided. In one embodiment, the method includes forming an opening in an interconnect dielectric material layer. Next, a first titanium metal layer is formed on the physically exposed surfaces of the interconnect dielectric material layer. A copper metal layer is then formed on the first titanium metal layer, and thereafter an anneal is performed to convert the first titanium metal layer into a first copper titanium alloy layer. After the anneal, remaining portions of the copper metal layer and the underlying portions of the first copper titanium alloy layer that are present on a topmost surface of the interconnect dielectric material layer are removed, while maintaining a portion of the copper metal layer and a portion of the first copper titanium alloy layer in the opening. Next, a second copper titanium alloy layer is formed on a topmost surface of the remaining portion of the copper metal layer, wherein the second copper titanium alloy layer is formed by converting a second titanium metal layer into the second copper titanium alloy layer.

DETAILED DESCRIPTION

Figure 1:
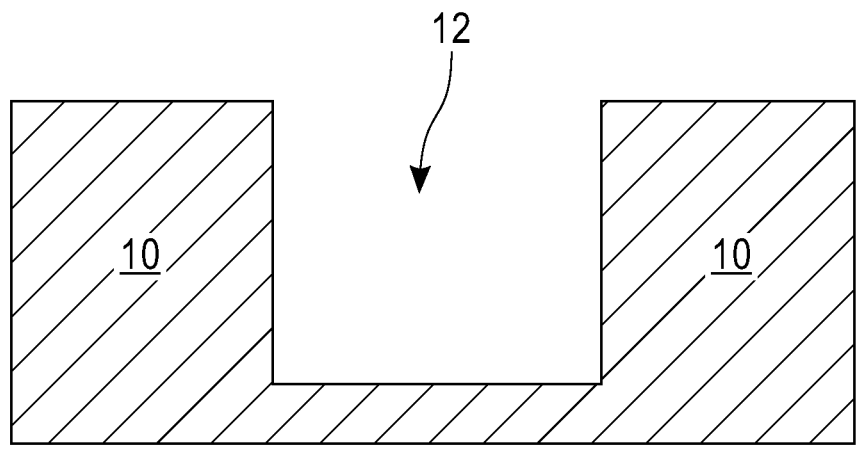
FIG. 1 is a cross sectional view of an exemplary structure including a first opening present in a first interconnect dielectric material layer that can be employed in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated a structure including a first opening 12 present in a first interconnect dielectric material layer 10 that can be employed in accordance with an embodiment of the present application. In some embodiments (not shown), a base substrate can be located directly beneath the first interconnect dielectric material layer 10.

When present, the base substrate may be composed of a semiconductor material, an insulator material, a conductive material or any combination thereof. When the base substrate is composed of a semiconductor material, any material having semiconducting properties such as, for example, Si, SiGe, SiGeC, SiC, Ge alloys, III/V compound semiconductors or II/VI compound semiconductors, may be used. In addition to these listed types of semiconductor materials, base substrate can be a layered semiconductor such as, for example, Si/SiGe, Si/SiC, silicon-on-insulators (SOIs) or silicon germanium-on-insulators (SGOIs).

When the base substrate is an insulator material, the insulator material can be an organic dielectric material, an inorganic dielectric material or any combination thereof including multilayers. The insulator material that may provide the base substrate is typically, but not necessarily always, composed of a different dielectric material than the first interconnect dielectric material layer 12. When base substrate is a conductive material, base substrate may include, for example, polySi, an elemental metal, alloys of elemental metals, a metal silicide, a metal nitride or any combination thereof including multilayers.

When base substrate is composed of a semiconductor material, one or more semiconductor devices such as, for example, complementary metal oxide semiconductor (CMOS) devices can be fabricated thereon. When base substrate is composed of a combination of an insulator material and a conductive material, base substrate may represent an underlying interconnect level of a multilayered interconnect structure.

The first interconnect dielectric material layer 10 may include any interlevel or intralevel dielectric material including inorganic dielectrics or organic dielectrics. A single interlevel or intralevel dielectric material may be used, or a multilayered dielectric material stack of at least two different interlevel or intralevel dielectrics may be used. In one embodiment, the first interconnect dielectric material layer 10 may be non-porous. In another embodiment, the first interconnect dielectric material layer 10 may be porous. Some examples of suitable dielectrics that can be used as the first interconnect dielectric material layer 10 include, but are not limited to, $SiO_2$, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The dielectric material that provides the first interconnect dielectric material layer 10 typically has a dielectric constant that is about 4.0 or less, with a dielectric constant of about 2.8 or less being more typical. All dielectric constants mentioned herein are relative to a vacuum, unless otherwise noted. These dielectric materials generally have a lower parasitic cross talk as compared with dielectric materials that have a higher dielectric constant than 4.0. The thickness of dielectric material that provides the first interconnect dielectric material layer 10 may vary depending upon the type of dielectric material(s) used. In one example, the dielectric material that provides the first interconnect dielectric material layer 10 may have a thickness from 50 nm to 1000 nm. Other thicknesses that are lesser than, or greater than, the aforementioned thickness range may also be employed in the present application for the thickness of the dielectric material that provides the first interconnect dielectric material layer 10.

The dielectric material that provides the first interconnect dielectric material layer 10 may be formed utilizing a deposition process such as, for example, chemical vapor deposition (CVD), plasma enhanced chemical vapor deposition (PECVD) or spin-on coating.

After providing the first interconnect dielectric material layer 10, a first opening 12 is formed into the first interconnect dielectric material layer 10. Although the present application describes and illustrates forming a single first opening 12 into the first interconnect dielectric material layer 10, a plurality of openings can be formed into the first interconnect dielectric material layer 10.

The opening 12 can be formed utilizing a patterning process. In one embodiment, the patterning process may include lithography and etching. The lithographic process includes forming a photoresist (not shown) atop a material or material stack to be patterned, i.e., the first interconnect dielectric material layer 10, exposing the photoresist to a desired pattern of radiation, and developing the exposed photoresist utilizing a conventional resist developer. The photoresist may be a positive-tone photoresist, a negative-tone photoresist or a hybrid-tone photoresist. The etching process includes a dry etching process (such as, for example, reactive ion etching, ion beam etching, plasma etching or laser ablation), and/or a wet chemical etching process. Typically, reactive ion etching is used in providing the opening 12 into the first interconnect dielectric material layer 10. In some embodiments as is shown, the opening 12 stops within the first interconnect dielectric material layer 10 exposing a sub-surface portion of the first interconnect dielectric material layer 10. By "sub-surface portion" it is meant a portion of a material that is located between a topmost surface and a bottommost surface of the material. In yet another embodiment (not shown), the opening 12 may extend through the entirety of the first interconnect dielectric material layer 10. When multiple openings are formed, the openings may have a same depth, or they may have different depths.

The opening 12 may be a via opening, a line opening, and/or a combined via/line opening. In one embodiment, and when a combined via/line opening is formed, a via opening can be formed first and then a line opening is formed atop and in communication with the via opening. In another embodiment, and when a combined via/line opening is formed, a line opening can be formed first and then a via opening is formed atop and in communication with the line opening. In FIG. 1, and by way of an example, the opening 12 is a via opening. When a combined via/line is formed a dual damascene process (including at least one iteration of the above mentioned lithography and etching steps) can be employed.

Figure 2:
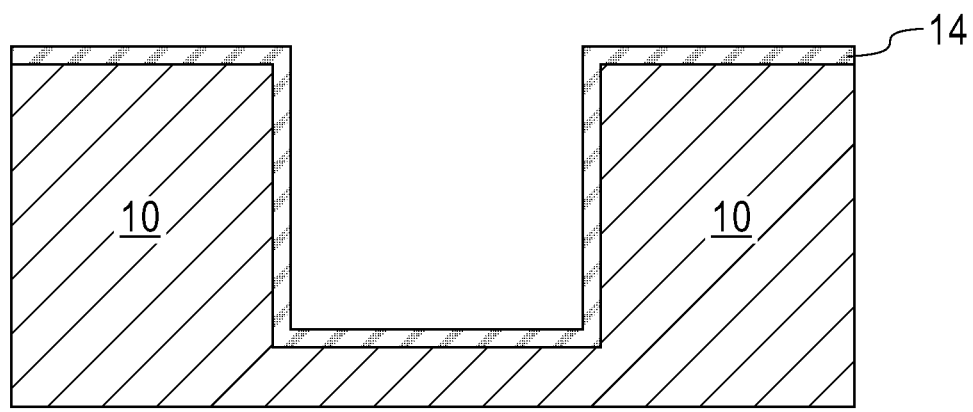
FIG. 2 is a cross sectional view of the exemplary structure of FIG. 1 after forming a first titanium metal layer on the exposed surfaces of the first interconnect dielectric material layer.

Referring now to FIG. 2, there is illustrated the exemplary structure of FIG. 1 after forming a first titanium metal layer 14 on the exposed surfaces of the first interconnect dielectric material layer 10. The first titanium metal layer 14 is a continuous layer that is formed on the topmost surface of the first interconnect dielectric material layer 10 and the exposed material within the opening 12. The first titanium metal layer 14 is composed of titanium metal (i.e., unalloyed titanium). The first titanium metal layer 14 can be formed utilizing a deposition process such as, for example, chemical vapor deposition (CVD), plasma enhanced chemical vapor deposition (PECVD), atomic layer deposition (ALD), physical vapor deposition (PVD), sputtering, chemical solution deposition or plating. The first titanium metal layer 14 may have a thickness from 1 nm to 50 nm; although other thicknesses for the first titanium metal layer 14 are contemplated and can be employed in the present application so long as the opening 12 is not entirely filled with the first titanium metal layer 14.

Figure 3:
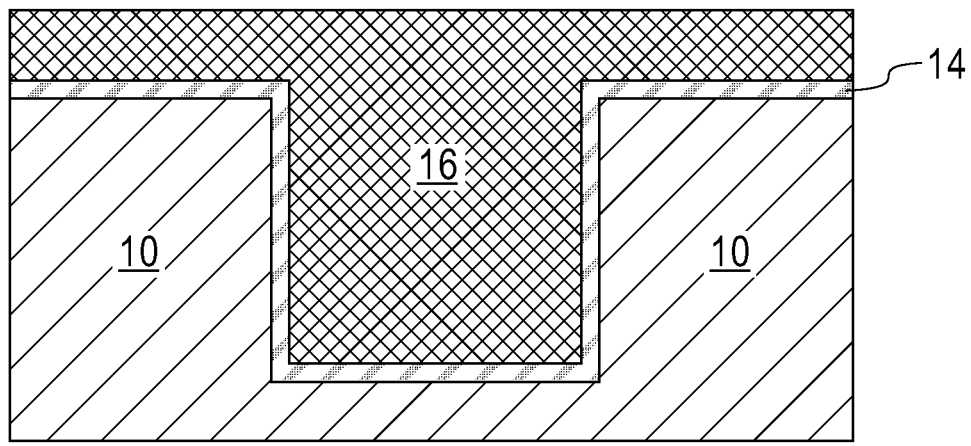
FIG. 3 is a cross sectional view of the exemplary structure of FIG. 2 after forming a first copper metal layer on the first titanium metal layer.

Referring now to FIG. 3, there is illustrated the exemplary structure of FIG. 2 after forming a first copper metal layer 16 on the first titanium metal layer 14. In some embodiments and as shown, the first copper metal layer 16 fills in a remaining volume of the opening 12 and an overburden portion is present outside the opening 12. In other embodiments (not shown), the first copper metal layer 16 partially fills the opening 12 and a subsequently performed reflow anneal can be used to completely fill the opening 12 with the first copper metal layer 16. In such an embodiment, a thickness of the first copper metal layer along horizontal surfaces is thicker than the thickness of the first copper metal layer along vertical surfaces.

The first copper metal layer 16 is composed of copper metal (i.e., unalloyed copper). The first copper metal layer 16 can be formed utilizing a deposition process such as, for example, chemical vapor deposition (CVD), plasma enhanced chemical vapor deposition (PECVD), sputtering, chemical solution deposition or plating. In one embodiment, a bottom-up plating process is employed in forming the first copper metal layer 16.

Figure 4:
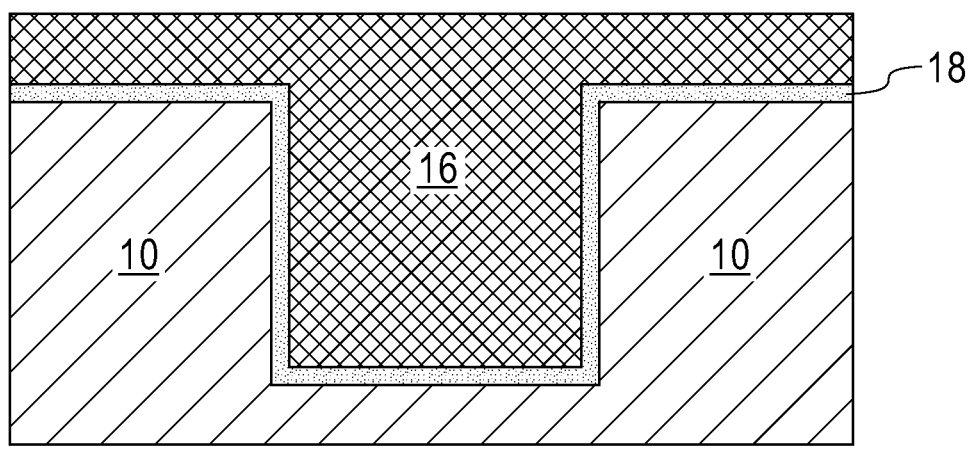
FIG. 4 is a cross sectional view of the exemplary structure of FIG. 3 after performing an anneal in a reducing ambient to convert the first titanium metal layer into a first copper titanium alloy layer.

Referring now to FIG. 4, there is illustrated the exemplary structure of FIG. 3 after performing an anneal in a reducing ambient to convert the first titanium metal layer 14 into a first copper titanium alloy layer 18. As is shown, the anneal in the reducing ambient may consume the entirety of the first titanium metal layer 14. In some embodiments, a portion of the first titanium metal layer 14 may remain beneath the first copper titanium alloy layer 18. In such an embodiment, an upper portion of the first titanium metal layer 14 that is nearest to the first copper metal layer 16 is consumed. During the anneal, copper ions migrate from the copper layer into the titanium metal layer converting the titanium metal layer into a copper titanium alloy.

By "reducing ambient" it is meant that the anneal is performed in an atmospheric condition in which oxidation is prevented by removal of oxygen and other oxidizing gases and/or vapors. In one embodiment of the present application, the reducing ambient that can be employed may include any actively reducing gas such as, for example, hydrogen. In one embodiment, the anneal in the reducing ambient may be performed at a temperature of from 100° C. to 450° C. In one embodiment, the anneal in the reducing ambient may be performed for a duration from 2 minutes to 60 minutes. Other anneal temperatures and times are also possible so long as the selected annealing conditions are capable of forming the first copper titanium alloy layer 18.

The first copper titanium alloy layer 18 is a copper rich titanium alloy. By "copper rich" it is meant that the first copper titanium alloy layer 18 contains a higher amount of copper than titanium. In one embodiment, the first copper titanium alloy layer 18 may be a $Cu_4Ti$ alloy. At this point of the present application and within the first opening 12, the first copper titanium alloy layer 18 is present on the sidewalls and a bottommost surface of the remaining first copper metal layer 16.

In some embodiments, a reflow anneal may now be performed to completely fill in the remaining volume of the opening 12 with copper. The reflow anneal may include well known reflow anneal conditions including, for example, annealing in an inert ambient (i.e., helium and/or argon) and at a temperature of from 100° C. to 350° C.

Figure 5:
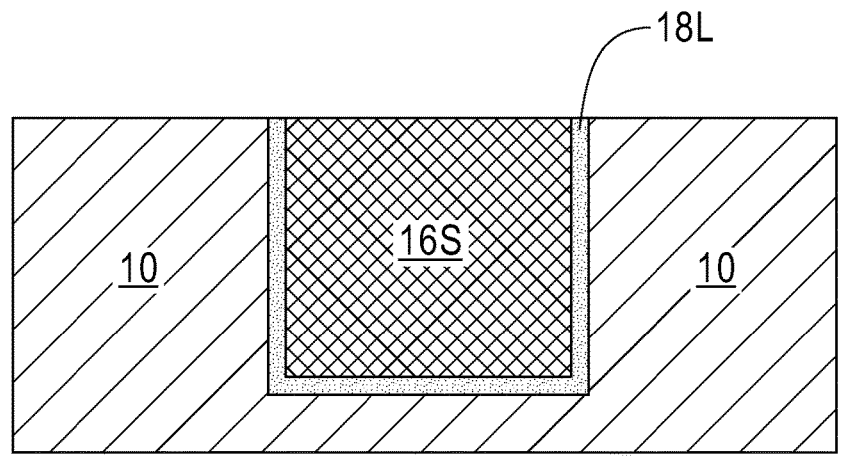
FIG. 5 is a cross sectional view of the exemplary structure of FIG. 4 after removing remaining portions of the first copper metal layer and the underlying portions of the first copper titanium alloy layer that are present on the topmost surface of the first interconnect dielectric material, while maintaining a first copper structure and a first copper titanium alloy liner in the first opening.

Referring now to FIG. 5, there is illustrated the exemplary structure of FIG. 4 after removing remaining portions of the first copper metal layer 16 and the underlying portions of the first copper titanium alloy layer 18 that are present on the topmost surface of the first interconnect dielectric material layer 10, while maintaining a first copper structure 16S and a first copper titanium alloy liner 18L in the first opening 12. The first copper structure 16S that is maintained in the first opening 12 constitutes a remaining portion of the first copper metal layer 16, while the first copper titanium alloy liner 18L that is maintained in the first opening 12 constitutes a remaining portion of the first copper titanium alloy layer 18.

The removal of the remaining portions of the first copper metal layer 16 and the underlying portions of the first copper titanium alloy layer 18 that are present on the topmost surface of the first interconnect dielectric material layer 10 may be performed utilizing a planarization process such as, for example, chemical mechanical polishing and/or grinding. The term "chemical mechanical polishing" or CMP for short is a process of smoothing surfaces with the combination of chemical and mechanical forces.

As is shown in FIG. 5, the first copper titanium alloy liner 18L is present on sidewall surfaces and a bottommost surface of the first copper structure 16S. As is further shown, the first copper titanium alloy liner is U-shaped. By "U-shaped" it is meant that a material has a horizontal portion and two vertical portions that extend upwards from each end of the horizontal portion. The first copper titanium alloy liner 18L has topmost surfaces that are coplanar with a topmost surface of the first copper structure 16S as well as a topmost surface of the first interconnect dielectric material layer 10.

Figure 6:
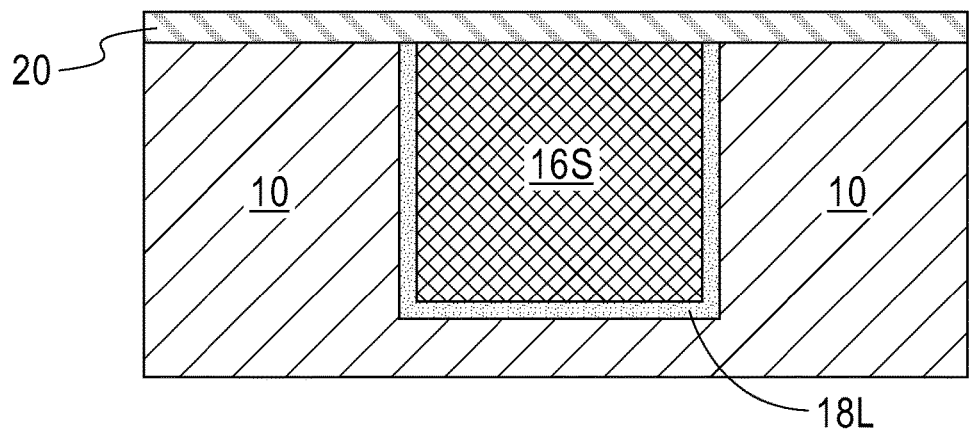
FIG. 6 is a cross sectional view of the exemplary structure of FIG. 5 after forming a first dielectric capping layer.

Referring now to FIG. 6, there is illustrated the exemplary structure of FIG. 5 after forming a first dielectric capping layer 20. In some embodiments, the formation of the first dielectric capping layer 20 may be omitted. When present, the first dielectric capping layer 20 is formed on the physically exposed topmost surfaces of the first interconnect dielectric material layer 10, the first copper titanium alloy liner 18L and the first copper structure 16S.

When present, the first dielectric capping layer 20 may include any dielectric capping material such as, for example, silicon carbide (SiC), silicon nitride ($Si_3N_4$), silicon dioxide ($SiO_2$), a carbon doped oxide, a nitrogen and hydrogen doped silicon carbide (SiC(N,H)) or a multilayered stack of at least one of the aforementioned dielectric capping materials. The dielectric capping material that provides the first dielectric capping layer 20 may be formed utilizing a deposition process such as, for example, chemical vapor deposition (CVD), plasma enhanced chemical vapor deposition (PECVD), atomic layer deposition (ALD), chemical solution deposition or evaporation. When present, first dielectric capping layer 20 may have a thickness from 10 nm to 100 nm. Other thicknesses that are lesser than 10 nm, or greater than 100 nm may also be used as the thickness of the first dielectric capping layer 20.

Figure 7:
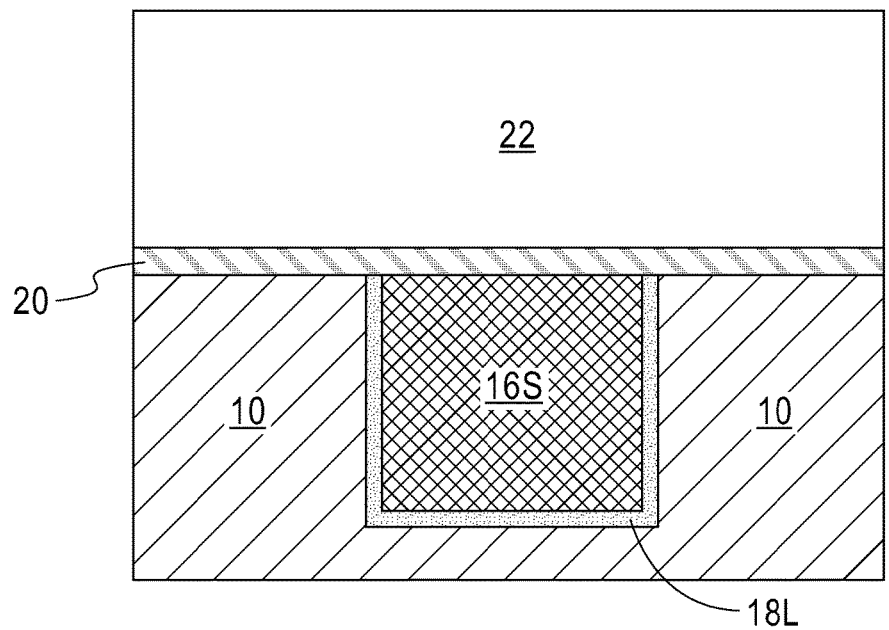
FIG. 7 is a cross sectional view of the exemplary structure of FIG. 6 after forming a second interconnect dielectric material layer on the first dielectric capping layer.

Referring now to FIG. 7, there is illustrated the exemplary structure of FIG. 6 after forming a second interconnect dielectric material layer 22 on the first dielectric capping layer 20. In embodiments in which the first dielectric capping layer 20 is omitted, the second interconnect dielectric material layer 22 is formed directly upon the structure exemplified in FIG. 5 of the present application.

The second interconnect dielectric material layer 22 may include one of the dielectric materials mentioned above for the first interconnect dielectric material layer 10. In one embodiment, the dielectric material that provides the second interconnect dielectric material layer 22 is the same as the dielectric material that provides the first interconnect dielectric material layer 10. In another embodiment, the dielectric material that provides the second interconnect dielectric material layer 22 is different from the dielectric material that provides the first interconnect dielectric material layer 10. The second interconnect dielectric material layer 22 may be formed utilizing one of the deposition processes mentioned above for forming the first interconnect dielectric material layer 10. The second interconnect dielectric material layer 22 may have a thickness within the range mentioned above for the first interconnect dielectric material layer 10.

Figure 8:
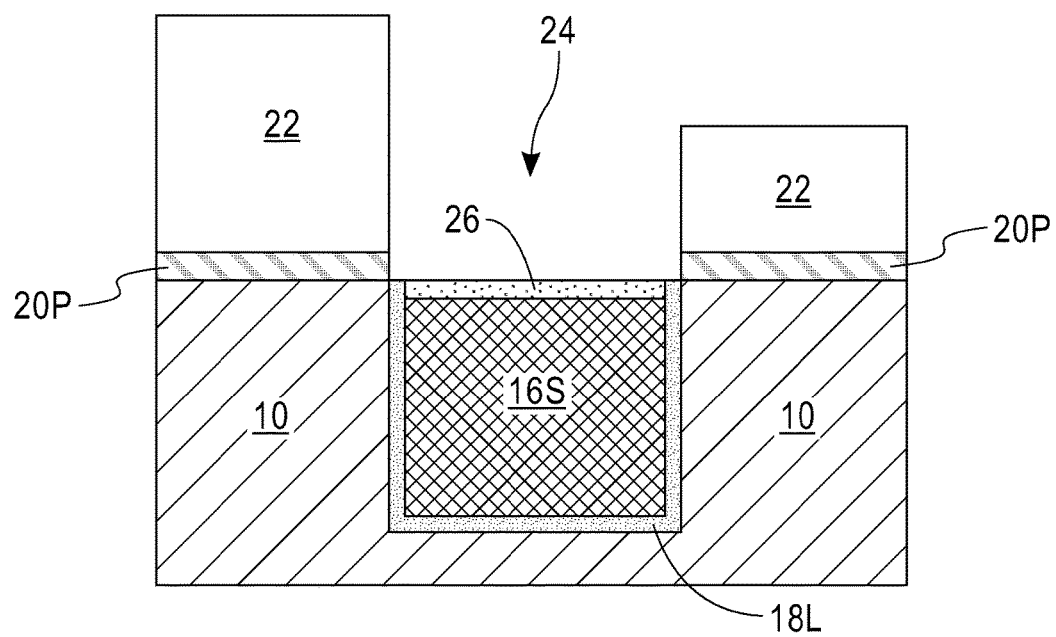
FIG. 8 is a cross sectional view of the exemplary structure of FIG. 7 after forming a second opening in the second interconnect dielectric material layer that exposes a topmost surface of the first copper structure and forming a surface passivation layer in an upper portion of the first copper structure.

Referring now to FIG. 8, there is illustrated the exemplary structure of FIG. 7 after forming a second opening 24 in the second interconnect dielectric material layer 22 that exposes a topmost surface of the first copper structure 16S and forming a surface passivation layer 26 in an upper portion of the first copper structure 16S. In embodiments in which a first dielectric capping layer 20 is present, the second opening 24 extends through the first dielectric capping layer 20. Each remaining portion of the first dielectric capping layer 20 may be referred to herein as first dielectric capping layer portion 20P.

The second opening 24 may be formed utilizing a patterning process as defined above for forming the first opening 12 in the first interconnect dielectric material layer 10. The second opening 24 may be a line opening, a via opening or a combined line and via opening. In FIG. 8, the second opening 24 is shown by way of one example as a combined line and via opening.

In one embodiment, the surface passivation layer 26 may be a surface oxide layer that includes copper oxide that is formed by exposing the upper portion of the first copper structure 16S to an oxygen-containing ambient such as, for example, oxygen or air. The exposure may be performed at a temperature from 0° C. to 50° C.

In another embodiment, the surface passivation layer 26 may be a nitride surface layer that includes copper nitride that is formed by exposing the upper portion of the first copper structure 16S to a nitrogen-containing ambient such as, for example, $N_2$, $NH_3$, $N_xO$, wherein x is between 1 and 2. The exposure may be performed at a temperature from 0° C. to 150° C.

In some embodiments, the surface passivation layer 26 is a result of air exposure between processing steps.

The surface passivation layer 26 can have a thickness from 1 nm to 10 nm. Other thicknesses for the surface passivation layer 26 are possible and are thus not excluded from being formed in the present application.

Figure 9:
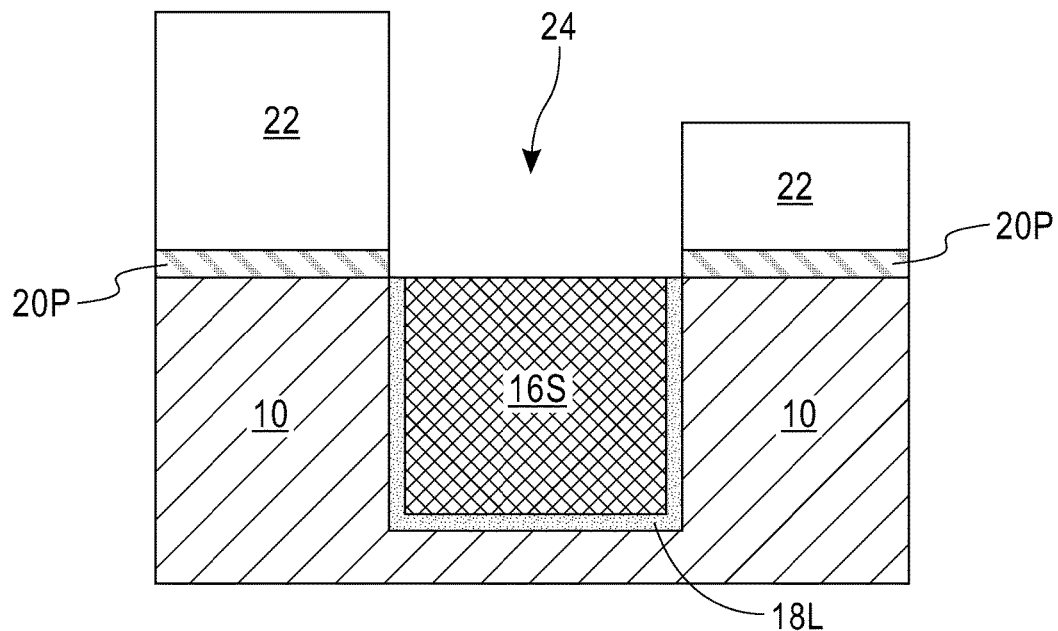
FIG. 9 is a cross sectional view of the exemplary structure of FIG. 8 after removing the surface passivation layer.

Referring now to FIG. 9, there is illustrated the exemplary structure of FIG. 8 after removing the surface passivation layer 26. After removing the surface passivation layer 26, the upper portion of the first copper structure 16S has an enhanced surface that can facilitate the adhesion of a subsequently formed titanium metal layer.

In one embodiment, and when the surface passivation layer 26 is a surface oxide layer, the surface oxide layer that provides the surface passivation layer 26 may be removed by exposing the surface oxide layer to a reducing ambient such as, for example, a hydrogen/helium plasma. The exposure may be performed at a temperature from 75° C. to 150° C.

In another embodiment, and when the surface passivation layer 26 is a surface nitride layer, the surface nitride layer that provides the surface passivation layer 26 may be removed by exposing the surface nitride layer to an $Ar/H_2$ ambient such as, for example, an $Ar/H_2$ plasma. The exposure may be performed at a temperature from 100° C. to 200° C.

Figure 10:
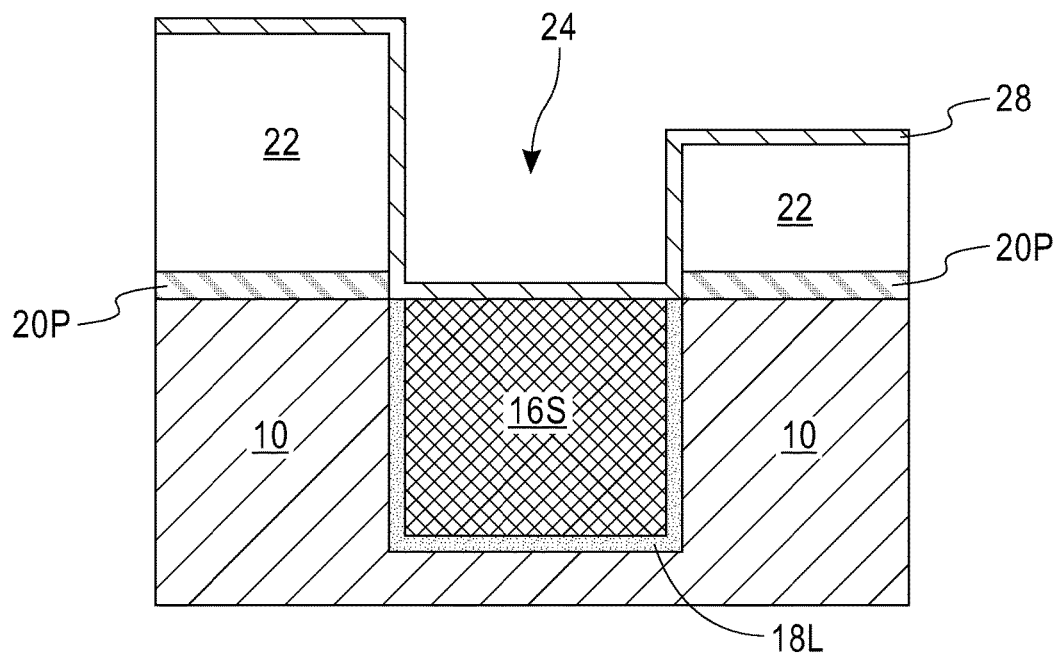
FIG. 10 is a cross sectional view of the exemplary structure of FIG. 9 after forming a second titanium metal layer on the exposed surfaces of the second interconnect dielectric material layer and the topmost surface of the first copper structure.

Referring now to FIG. 10, there is illustrated the exemplary structure of FIG. 9 after forming a second titanium metal layer 28 on the exposed surfaces of the second interconnect dielectric material layer 22 and the topmost surface of the first copper structure 16S. The second titanium metal layer 28 is a continuous layer that is composed of unalloyed titanium. The second titanium metal layer 28 is formed on a physical exposed topmost surface of the second interconnect dielectric material layer 22 and on all physically exposed material surfaces within the second opening 24. The second titanium metal layer 28 may be formed by one of the deposition processes as mentioned above for the first titanium metal layer 14. The second titanium metal layer 28 may have a thickness within the thickness range mentioned above for the first titanium metal layer 14.

Figure 11:
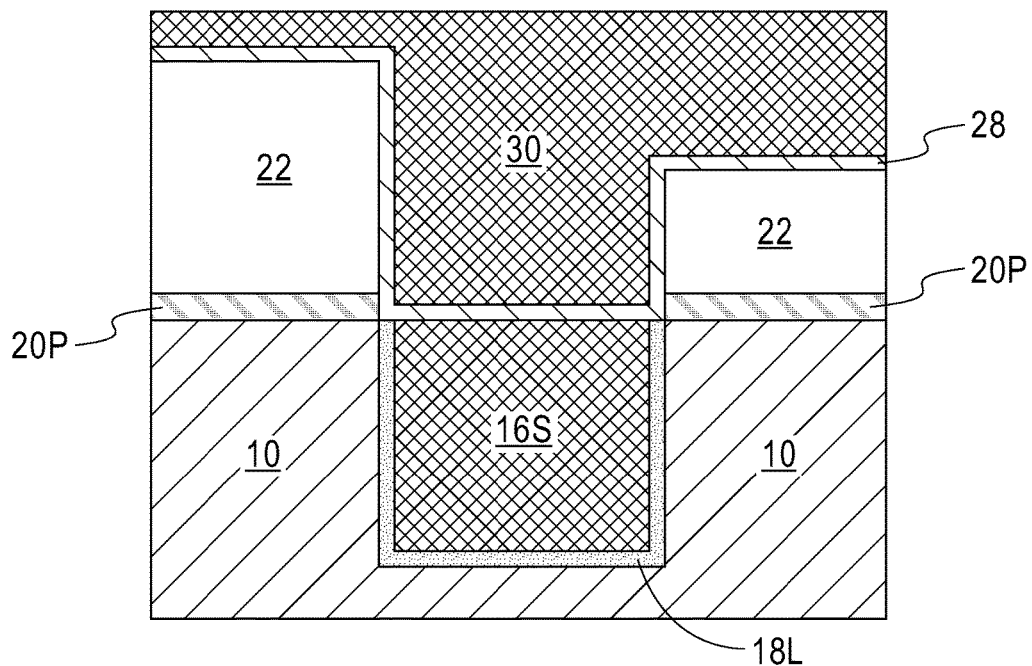
FIG. 11 is a cross sectional view of the exemplary structure of FIG. 10 after forming a second copper metal layer on the second titanium metal layer.

Referring now to FIG. 11, there is illustrated the exemplary structure of FIG. 10 after forming a second copper metal layer 30 on the second titanium metal layer 28. The second copper metal layer 30 which is composed of unalloyed copper can be formed utilizing one of the deposition processes mentioned above for forming the first copper metal layer 16. In some embodiments and as shown, the second copper metal layer 30 that is deposited may completely fill any remaining volume of the second opening 24. In yet other embodiments (not shown), the second copper metal layer 30 that is deposited partially fills the second opening and a subsequent reflow anneal may be used to completely fill in any remaining volume of the second opening 24.

Figure 12:
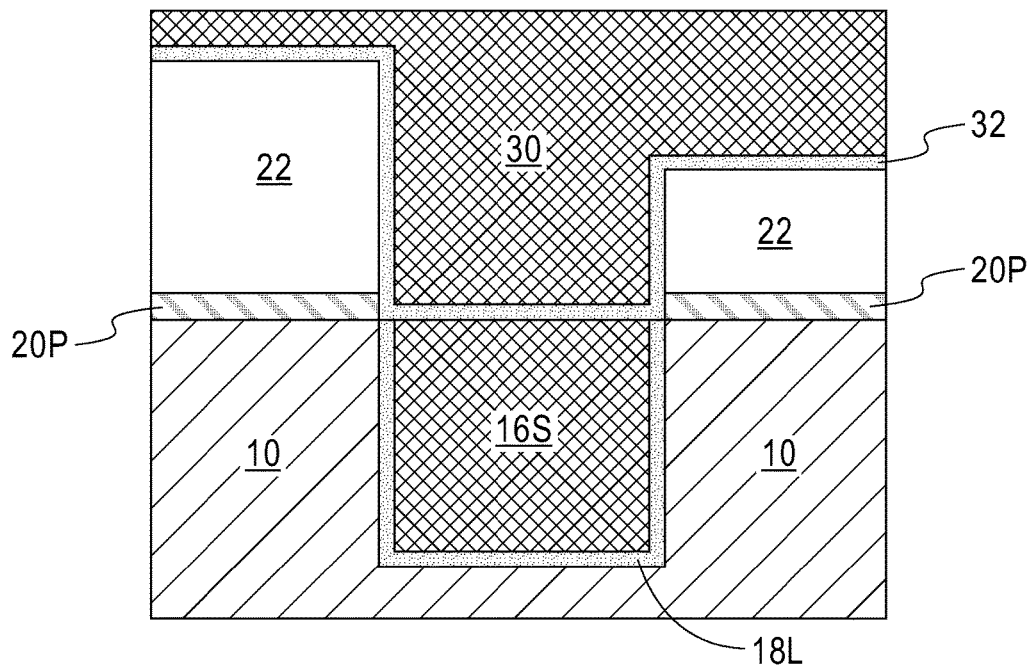
FIG. 12 is a cross sectional view of the exemplary structure of FIG. 11 after performing an anneal in a reducing ambient to convert the second titanium metal layer into a second copper titanium alloy layer.

Referring now to FIG. 12, there is illustrated the exemplary structure of FIG. 11 after performing an anneal in a reducing ambient to convert the second titanium metal layer 28 into a second copper titanium alloy layer 32. The anneal conditions and reducing ambient used in providing the second copper titanium alloy layer 32 are the same as that mentioned above in providing the first copper titanium alloy layer 18.

The second copper titanium alloy layer 28 is a copper rich titanium alloy. By "copper rich" it is meant that the second copper titanium alloy layer 28 contains a higher amount of copper than titanium. In one embodiment, the second copper titanium alloy layer 28 may be a $Cu_4Ti$ alloy. At this point of the present application and within the second opening 24, the second copper titanium alloy layer 28 is present on the sidewalls and a bottommost surface of the remaining second copper metal layer 30.

In some embodiments, a reflow anneal may now be performed to completely fill in the remaining volume of the opening 24 with copper. The reflow anneal may include well known reflow anneal conditions including, for example, annealing in an inert ambient (i.e., helium and/or argon) and at a temperature of from 100° C. to 350° C.

Figure 13:
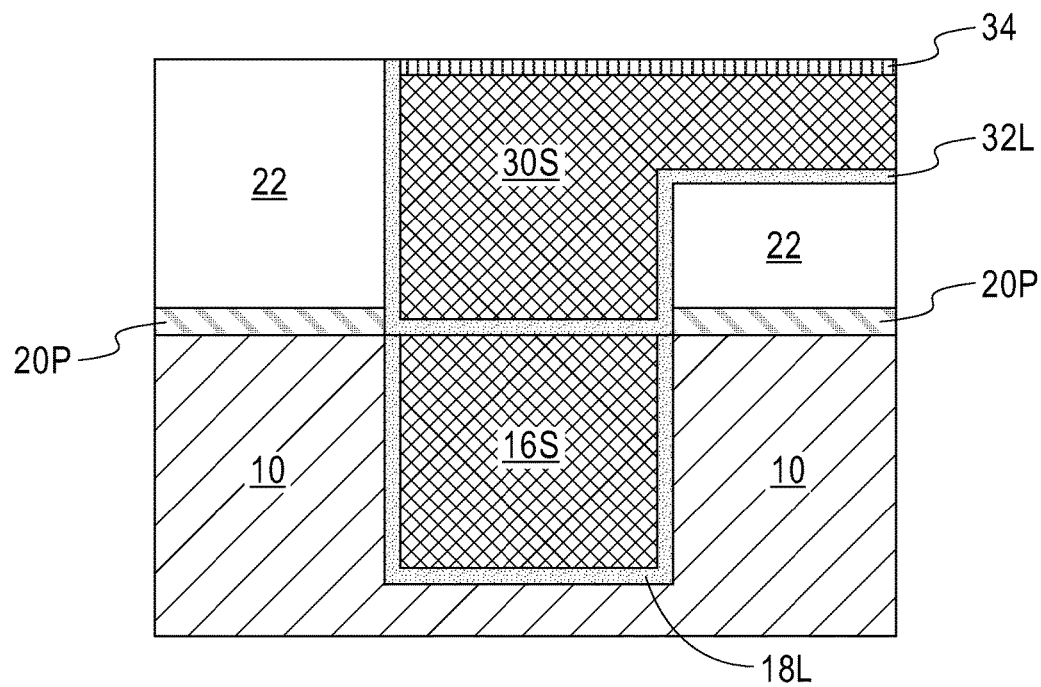
FIG. 13 is a cross sectional view of the exemplary structure of FIG. 12 after removing remaining portions of the second copper metal layer and the underlying portions of the second copper titanium alloy layer that are present on the topmost surface of the second interconnect dielectric material layer, while maintaining a second copper structure and a second copper titanium alloy liner in the second opening and forming a surface passivation layer in an upper portion of the second copper structure.

Referring now to FIG. 13, there is illustrated the exemplary structure of FIG. 12 after removing remaining portions of the second copper metal layer 30 and the underlying portions of the second copper titanium alloy layer 32 that are present on the topmost surface of the second interconnect dielectric material layer 22, while maintaining a second copper structure 30S and a second copper titanium alloy liner 32L in the second opening 24 and forming a surface passivation layer 34 in an upper portion of the second copper structure 30S. The second copper structure 30S that is maintained in the second opening 24 constitutes a remaining portion of the second copper metal layer 30, while the second copper titanium alloy liner 32L that is maintained in the second opening 24 constitutes a remaining portion of the second copper titanium alloy layer 32.

The removal of the remaining portions of the second copper metal layer 30 and the underlying portions of the first copper titanium alloy layer 32 that are present on the topmost surface of the second interconnect dielectric material layer 22 may be performed utilizing a planarization process such as, for example, chemical mechanical polishing and/or grinding.

As is shown in FIG. 13, the second copper titanium alloy liner 32L is present on sidewall surfaces and a bottommost surface of the second copper structure 30S. As is further shown, the portion of the second copper titanium alloy liner 32L that is present on the bottommost surface of the second copper structure 16S is also present on the topmost surface of the first copper structure 16S. Thus, the first copper structure 16S is now completely encapsulated by a copper titanium alloy (i.e., the first copper titanium liner 18L and a portion of the second copper titanium alloy liner 32L). After planarization and prior to forming the surface passivation layer 34, the second copper titanium alloy liner 32L has topmost surfaces that are coplanar with a topmost surface of the second copper structure 30S as well as a topmost surface of the second interconnect dielectric material layer 22.

The surface passivation layer 34 that is formed within an upper portion of the second copper structure 30S may include a surface oxide or surface nitride passivation material as defined above for the surface passivation layer 26. The surface passivation layer 34 may be formed utilizing one of the techniques mentioned above in providing the surface passivation layer 26 to the first copper structure 16S.

Figure 14:
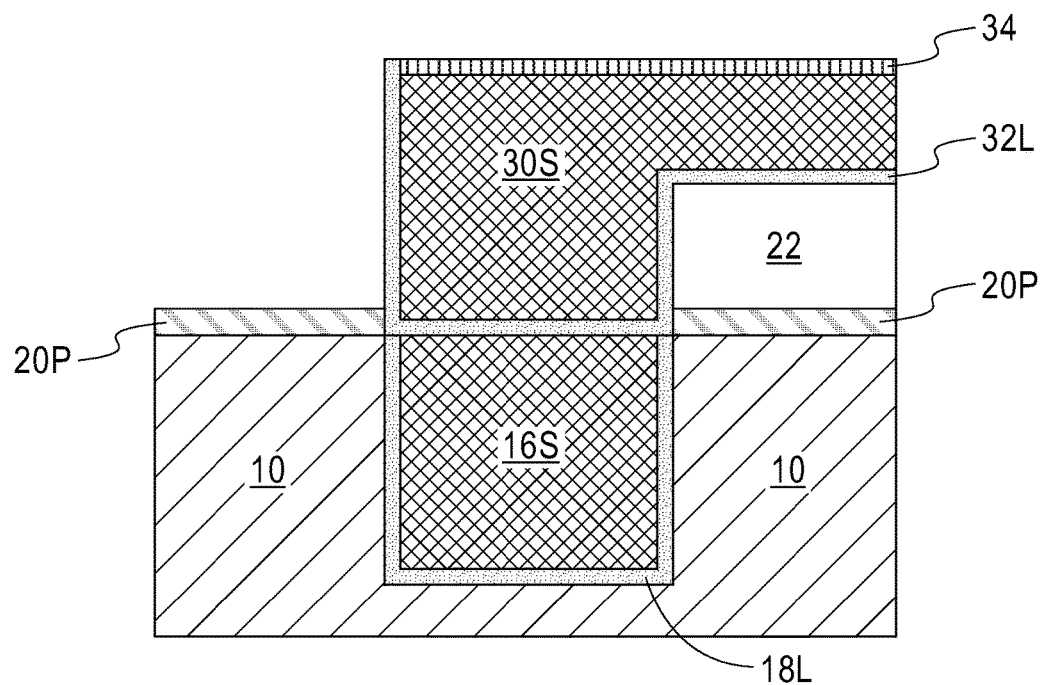
FIG. 14 is a cross sectional view of the exemplary structure of FIG. 13 after removing a physically exposed portion of the second interconnect dielectric material layer.

Referring now to FIG. 14, there is illustrated the exemplary structure of FIG. 13 after removing a physically exposed portion of the second interconnect dielectric material layer 22. In some embodiments of the present application, this step of the present application may be omitted. In embodiments in which the physically exposed portion of the second interconnect dielectric material layer 22 is removed, the removal is performed utilizing an etch that is selective in removing the dielectric material that provides the second interconnect dielectric material layer 22. The etch stops on either a topmost surface of the first dielectric capping layer portion 20P, or a topmost surface of the first interconnect dielectric material layer 10.

Figure 15:
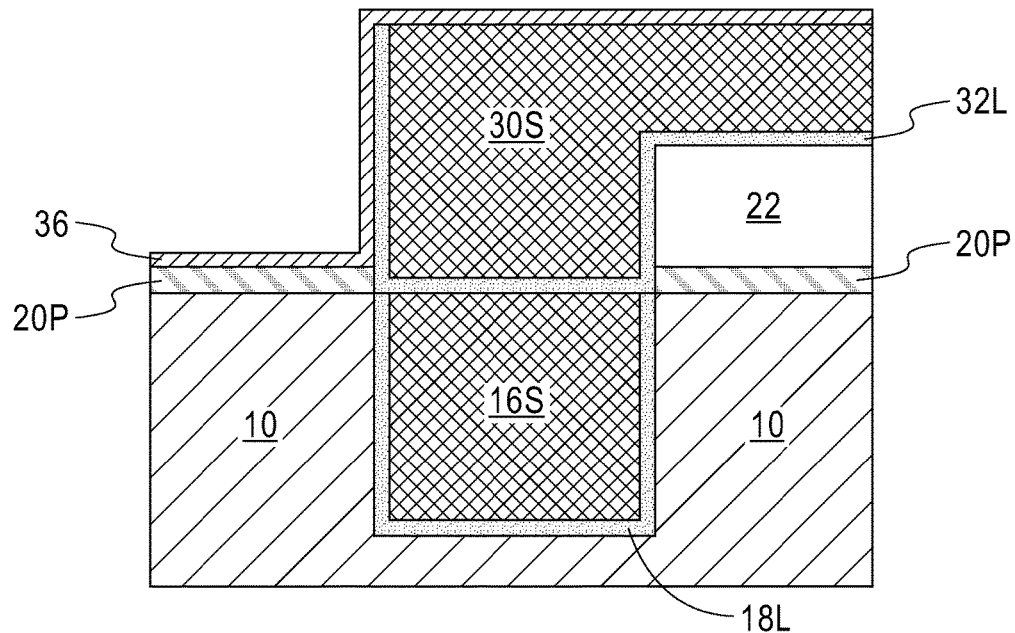
FIG. 15 is a cross sectional view of the exemplary structure of FIG. 14 after removing the surface passivation layer and forming a third titanium metal layer.

Referring now to FIG. 15, there is illustrated the exemplary structure of FIG. 14 after removing the surface passivation layer 34 and forming a third titanium metal layer 36. The surface passivation layer 34 may be removed utilizing one of the techniques mentioned above in removing the surface passivation layer 26 from the first copper structure 16S. The third titanium metal layer 36 which is composed of unalloyed titanium can be formed utilizing one of the deposition processes mentioned above for forming the first titanium metal layer 14. In the illustrated embodiment, the third titanium metal layer 36 is formed on a physically exposed topmost surface of the second copper structure 30S, along physically exposed sidewalls of the second copper titanium alloy liner 22L and on a physically exposed topmost surface of the first dielectric capping layer portion 20P. In embodiments in which the step of removing a physically exposed portion of the second interconnect dielectric material layer 22 is omitted, the third titanium metal layer 36 is formed on the physically exposed topmost surface of each of the second copper structure 30S and the second interconnect dielectric material layer 22.

Figure 16:
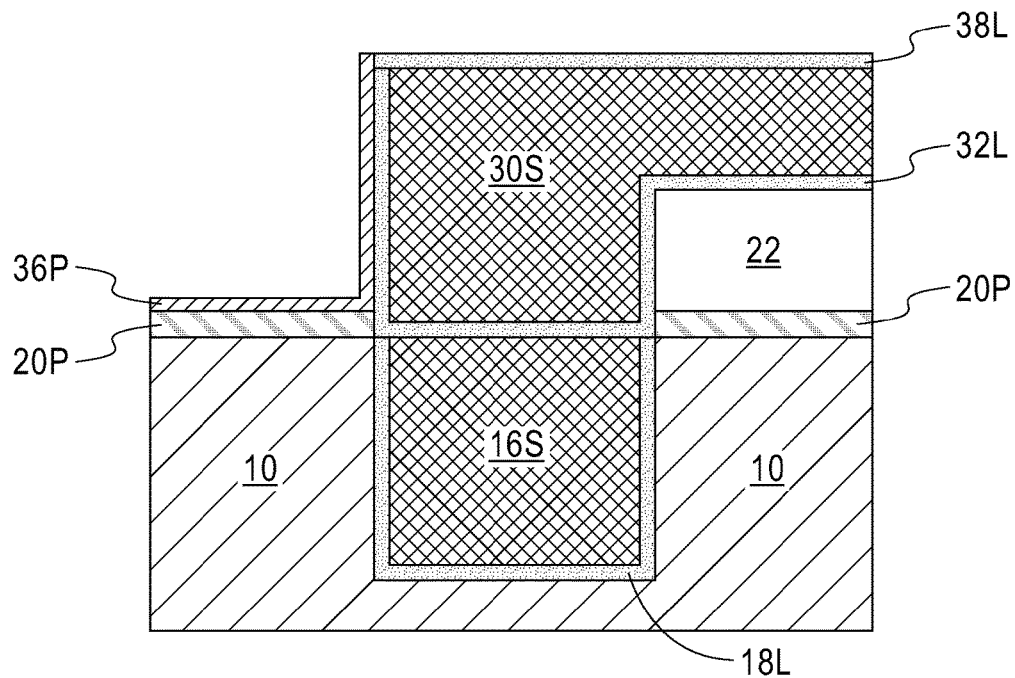
FIG. 16 is a cross sectional view of the exemplary structure of FIG. 15 after performing an anneal in a reducing ambient to convert the third titanium metal layer into a third copper titanium alloy layer.

Referring now to FIG. 16, there is illustrated the exemplary structure of FIG. 15 after performing an anneal in a reducing ambient to convert the third titanium metal layer 36 into a third copper titanium alloy layer 38L. In the illustrated embodiment, the third copper titanium alloy layer 38L is formed only atop the second copper structure 30S. A portion of the third titanium metal layer (hereinafter third titanium metal layer portion 36P) remains after the anneal as shown in FIG. 16. The anneal and reducing ambient used in providing the third copper titanium alloy layer 38L is the same as that mentioned above in providing the first copper titanium alloy layer 18.

The third copper titanium alloy layer 38L is a copper rich titanium alloy. By "copper rich" it is meant that the third copper titanium alloy layer 38L contains a higher amount of copper than titanium. In one embodiment, the third copper titanium alloy layer 38L may be a $Cu_4Ti$ alloy.

As is shown in FIG. 16, the second copper structure 30S is now completely encapsulated by a copper titanium alloy. Notably, the second copper structure 30S is encapsulated on the sidewalls and bottommost surface by the second copper titanium alloy liner 32L, and on its topmost surface by the third copper titanium alloy layer 38L.

Figure 17:
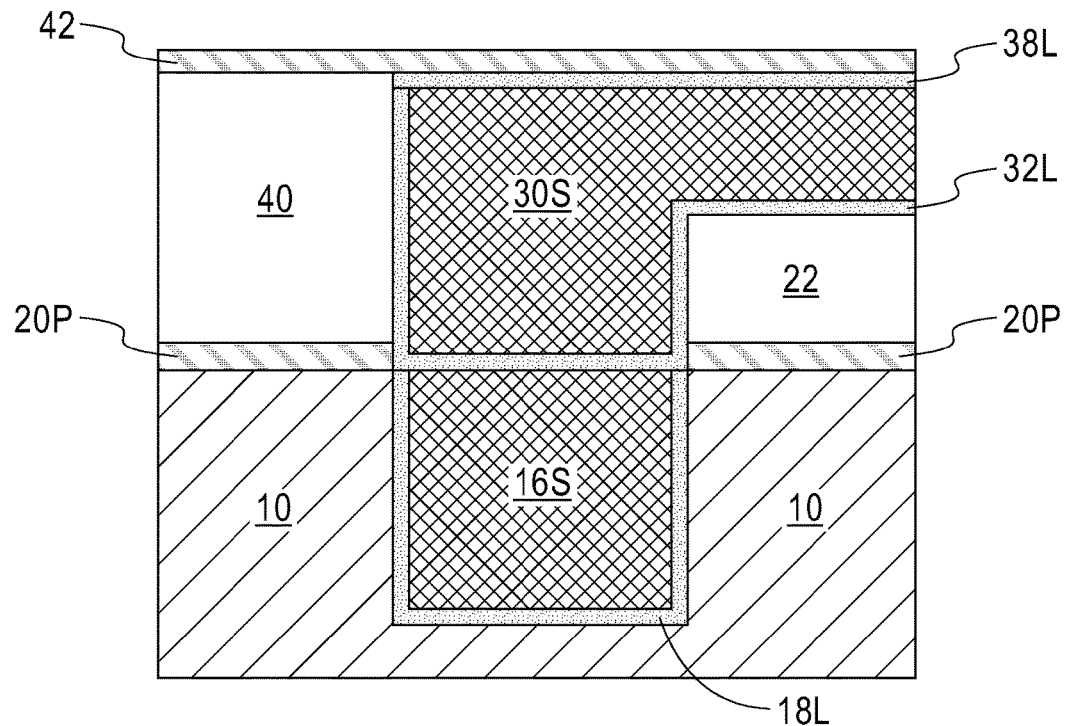
FIG. 17 is a cross sectional view of the exemplary structure of FIG. 16 after removing remaining portions of the third titanium metal layer, forming an additional interconnect dielectric material, and forming a second dielectric capping layer.

Referring now to FIG. 17, there is illustrated the exemplary structure of FIG. 16 after removing remaining portions of the third titanium metal layer (i.e., the third titanium metal layer portion 36P), forming an additional interconnect dielectric material 40, and forming a second dielectric capping layer 42. The formation of additional interconnect dielectric material 40 may be omitted in embodiments in which the physically exposed portion of the second interconnect dielectric material layer 22 are not removed. The formation of the second dielectric capping layer 42 may also be omitted.

The removal each third titanium metal layer portion 36P may be performed utilizing an etch that is selective in removing titanium metal. In one example, each third titanium metal layer portion 36P may be removed by etching in a wet solution containing $NH_4OH$ and other species.

The additional interconnect dielectric material 40 may comprise a same or different interconnect dielectric material than the second interconnect dielectric material layer 22. The additional interconnect dielectric material 40 may be formed utilizing one of the deposition processes mentioned above in providing the first interconnect dielectric material layer 10.

When present, the second dielectric capping layer 42 may include one of the dielectric capping materials mentioned above for the first dielectric capping layer 20. In one embodiment, the dielectric capping material that provides the second dielectric capping layer 42 may include a same dielectric capping material as that which provides the first dielectric capping layer 20. In another embodiment, the dielectric capping material that provides the second dielectric capping layer 42 may include a different dielectric capping material than that which provides the first dielectric capping layer 20. The second dielectric capping layer 42 may be formed utilizing one of the deposition processes mentioned above for the first dielectric capping layer 20. The second dielectric capping layer 42 may have a thickness within the thickness range mentioned above for the first dielectric capping layer 42.

The steps shown in FIGS. 7-17 and described above can be repeated any number of times to provide additional copper structures each of which is completely encapsulated with a copper titanium alloy.

Figure 18:
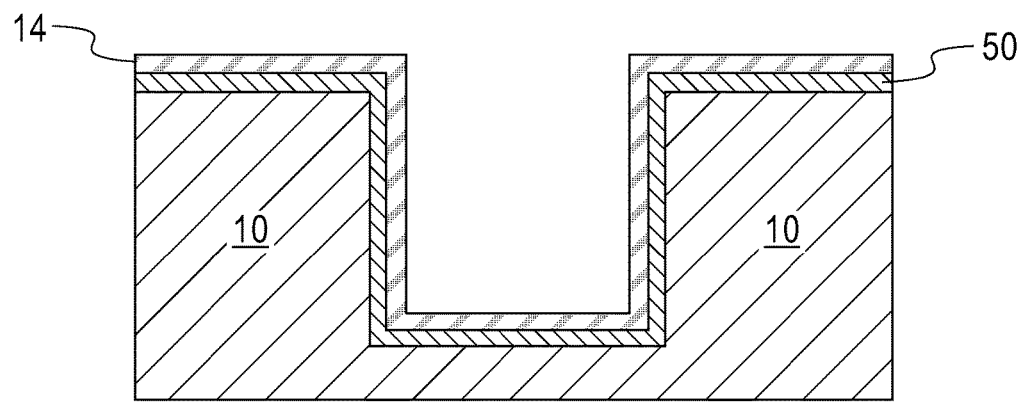
FIG. 18 is a cross sectional view of the exemplary structure of FIG. 1 after forming a material stack of, from bottom to top, a diffusion barrier material layer and a first titanium metal layer.

Referring now to FIG. 18, there is illustrated the exemplary structure of FIG. 1 after forming a material stack of, from bottom to top, a diffusion barrier material layer 50 and a first titanium metal layer 14.

The diffusion barrier material layer 50 is composed of a diffusion barrier material. The diffusion barrier material may be composed of TiN or any other material that can serve as a barrier to prevent a titanium metal from diffusing there through. In some embodiments, the diffusion barrier material layer 50 may have a thickness from 1 nm to 50 nm; although other thicknesses for the diffusion barrier material layer 50 are contemplated and can be employed in the present application so long as the entirety of the opening 12 is not filled with a diffusion barrier material layer 50. When a diffusion barrier material layer 50 is employed, the diffusion barrier material layer can be formed by a deposition process including, for example, chemical vapor deposition (CVD), plasma enhanced chemical vapor deposition (PECVD), atomic layer deposition (ALD), physical vapor deposition (PVD), sputtering, chemical solution deposition or plating.

Figure 19:
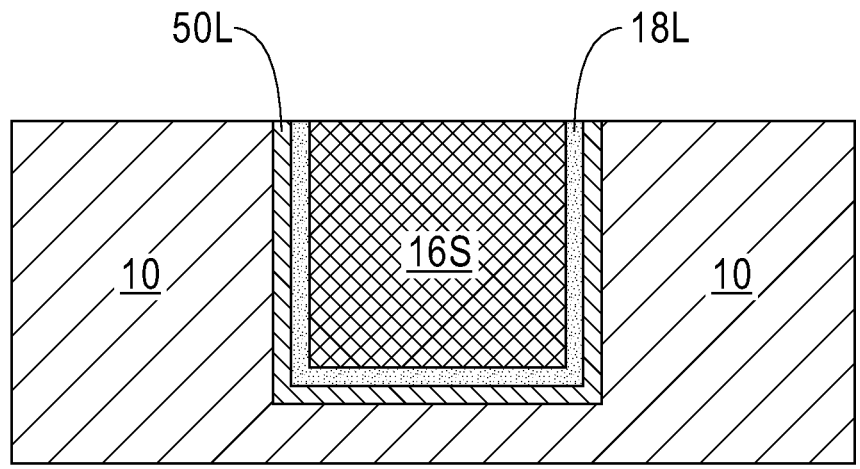
FIG. 19 is a cross sectional view of the exemplary structure of FIG. 18 after performing the processing steps of FIGS. 3-4.

Referring now to FIG. 19, there is illustrated the exemplary structure of FIG. 18 after performing the processing steps of FIGS. 3-4. In FIG. 19, element 50L denotes a diffusion barrier liner; element 18L denotes a copper titanium alloy liner that is formed in accordance with the method of the present application. In some embodiments, the diffusion barrier liner 50L may be composed of the same diffusion barrier material as that which provides the diffusion barrier layer 50. In other embodiment, the diffusion barrier liner 50L is composed of copper-diffusion barrier material alloy, e.g., a CuTiN alloy. The copper/diffusion barrier material alloy can form during the anneal used to provide the first copper titanium alloy liner.

Processing as shown in FIGS. 5-17 can be performed to provide a multilayered interconnect structure in which each copper structure that is present is completely encapsulated with a copper titanium alloy.

Figure 20:
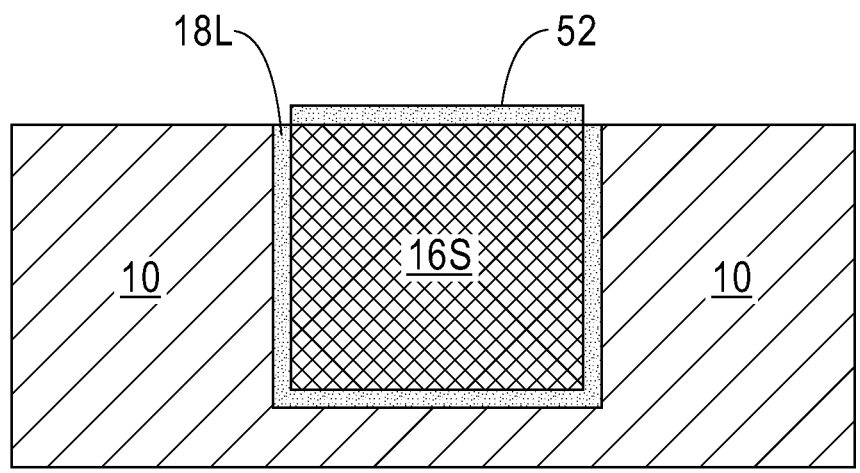
FIG. 20 is a cross sectional view of the exemplary structure of FIG. 5 after forming a copper titanium alloy on an upper portion of the first copper structure in accordance with another embodiment of the present application.

Referring now to FIG. 20, there is shown the exemplary structure of FIG. 5 after forming a copper titanium alloy 52 on an upper portion of the first copper structure 16S in accordance with another embodiment of the present application. The copper titanium alloy 52 can be formed by first forming and then removing a surface passivation layer from an upper portion of the first copper structure 16S. Next, a titanium metal layer is deposited on the physically exposed surfaces, and thereafter an anneal in a reducing ambient as defined above can be performed to convert the titanium metal layer into the copper titanium alloy 52. Any non-converted titanium metal layer can be removed utilizing a selective etch.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. An interconnect structure comprising:
a copper structure embedded in an interconnect dielectric material layer, wherein the copper structure has sidewalls, a bottommost surface and a topmost surface; and
a copper titanium alloy in direct physical contact with the sidewalls, the bottommost surface and the topmost surface of the copper structure.

2. The interconnect structure of claim 1, wherein the copper titanium alloy is composed of a copper rich titanium alloy.

3. The interconnect structure of claim 2, wherein the copper rich titanium alloy is composed of $Cu_4Ti$.

4. The interconnect structure of claim 1, further comprising a diffusion barrier liner located between sidewalls and a bottommost surface of the copper titanium alloy, and the interconnect dielectric material layer.

5. The interconnect structure of claim 1, further comprising a dielectric capping layer located on a topmost surface of the interconnect dielectric material layer.

6. The interconnect structure of claim 1, further comprising at least one additional copper structure located above the first copper structure, wherein each additional copper structure has sidewalls, a bottommost surface and a topmost surface and is embedded in another interconnect dielectric material layer, and wherein a copper titanium alloy is in direct physical contact with the sidewalls, the bottommost surface and the topmost surface of each additional copper structure.

7. An interconnect structure comprising:
a first copper structure embedded in a first interconnect dielectric material layer, wherein the first copper structure has sidewalls, a bottommost surface and a topmost surface;
a second copper structure located above the first copper structure and embedded in a second interconnect dielectric material layer, wherein the second copper structure has sidewalls, a bottommost surface and a topmost surface; and
a copper titanium alloy in direct physical contact with the sidewalls, the bottommost surface and the topmost surface of the first and second copper structures.

8. The interconnect structure of claim 7, wherein the copper titanium alloy is composed of a copper rich titanium alloy.

9. The interconnect structure of claim 8, wherein the copper rich titanium alloy is composed of $Cu_4Ti$.

10. The interconnect structure of claim 7, further comprising a diffusion barrier liner located between the sidewalls and bottommost surface of the copper titanium alloy, and at least one of the first and second interconnect dielectric material layers.

11. The interconnect structure of claim 7, further comprising a dielectric capping layer located on a topmost surface of at least one of the first and second interconnect dielectric material layers.

12. A method of forming an interconnect structure, the method comprising:
forming an opening in an interconnect dielectric material layer;
forming a first titanium metal layer on the physically exposed surfaces of the interconnect dielectric material layer;
forming a copper metal layer on the first titanium metal layer;
performing an anneal to convert the first titanium metal layer into a first copper titanium alloy layer;
removing remaining portions of the copper metal layer and the underlying portions of the first copper titanium alloy layer that are present on a topmost surface of the interconnect dielectric material layer, while maintaining a portion of the copper metal layer and a portion of the first copper titanium alloy layer in the opening; and
forming a second copper titanium alloy layer on a topmost surface of the remaining portion of the copper metal layer, wherein the second copper titanium alloy layer is formed by converting a second titanium metal layer into the second copper titanium alloy layer.

13. The method of claim 12, further comprising:
forming a surface passivation layer in an upper portion of the portion of the first copper layer that remains in the opening, wherein the forming the surface passivation layer is performed after the removing the remaining portions of the copper metal layer and the underlying portions of the first copper titanium alloy layer that are present on a topmost surface of the interconnect dielectric material layer, and prior to the forming the second copper titanium alloy layer.

14. The method of claim 13, further comprising removing the surface passivation layer prior to forming the second copper titanium alloy layer.

15. The method of claim 12, further comprising forming a diffusion barrier material layer in the opening prior to forming the titanium metal layer.

16. The method of claim 12, wherein the forming the second copper titanium alloy layer comprises:
forming another interconnect dielectric material layer above the interconnect dielectric material layer;
forming an opening in the another interconnect dielectric material layer, wherein the opening in the another interconnect dielectric material layer exposes a topmost surface of the portion of the copper metal layer that remains in the opening provided in the interconnect dielectric material layer;
depositing the second titanium metal layer on the another interconnect dielectric material layer and in the opening providing in the another interconnect dielectric material layer; and
forming another copper metal layer on the second titanium metal layer.

17. The method of claim 16, further comprising:
removing remaining portions of the second copper metal layer and the underlying portions of the second copper titanium alloy layer that are present on a topmost surface of the another interconnect dielectric material layer; and
forming a third copper titanium alloy layer on a topmost surface of the remaining portion of the second copper metal layer, wherein the third copper titanium alloy layer is formed by deposition a third titanium metal layer and converting the third titanium metal layer into the third copper titanium alloy layer.

18. The method of claim 17, further comprising:
forming a surface passivation layer in an upper portion of the second copper layer that remains in the opening present in the another interconnect dielectric layer, wherein the forming the surface passivation layer is performed after the removing the remaining portions of the second copper metal layer and the underlying portions of the second copper titanium alloy layer that are present on a topmost surface of the another interconnect dielectric material layer, and prior to the forming the third copper titanium alloy layer.

19. The method of claim 18, further comprising removing the surface passivation layer prior to forming the third copper titanium alloy layer.

20. The method of claim 18, wherein the forming the third copper titanium alloy comprises:
  removing a physically exposed portion of the another interconnect dielectric material layer; and
  forming a third titanium metal layer on physically exposed surfaces of the remaining portion of the second copper metal layer and along a vertical sidewall of a remaining portion of the second copper titanium alloy layer.

* * * * *